United States Patent
Shin et al.

(10) Patent No.: US 8,456,012 B2
(45) Date of Patent: Jun. 4, 2013

(54) INTER CONNECTION STRUCTURE INCLUDING COPPER PAD AND PAD BARRIER LAYER, SEMICONDUCTOR DEVICE AND ELECTRONIC APPARATUS INCLUDING THE SAME

(75) Inventors: Chang-Woo Shin, Seoul (KR); Hyun-Soo Chung, Hwaseong-si (KR); Eun-Chul Ahn, Yongin-si (KR); Jum-Gon Kim, Suwon-si (KR); Jin-Ho Chun, Seoul (KR)

(73) Assignee: SAMSUNG Electronics Co., Ltd., Suwon-si (KR)

( * ) Notice: Subject to any disclaimer, the term of this patent is extended or adjusted under 35 U.S.C. 154(b) by 883 days.

(21) Appl. No.: 12/568,086

(22) Filed: Sep. 28, 2009

(65) Prior Publication Data

US 2010/0078819 A1 Apr. 1, 2010

(30) Foreign Application Priority Data

Sep. 29, 2008 (KR) ........................ 10-2008-0095517

(51) Int. Cl.
*H01L 23/48* (2006.01)
*H01L 23/52* (2006.01)

(52) U.S. Cl.
USPC ...................... 257/773; 257/786; 257/E23.02

(58) Field of Classification Search
USPC ..................................... 257/773, 786, E23.02
See application file for complete search history.

(56) References Cited

U.S. PATENT DOCUMENTS

| | | | | |
|---|---|---|---|---|
| 6,004,867 | A | * | 12/1999 | Kim et al. ...................... 438/459 |
| 7,547,407 | B2 | * | 6/2009 | Matsuda et al. ............... 264/619 |
| 7,550,849 | B2 | * | 6/2009 | Mis et al. ....................... 257/750 |
| 7,855,461 | B2 | * | 12/2010 | Kuo et al. ...................... 257/780 |
| 7,932,615 | B2 | * | 4/2011 | Rinne ............................ 257/786 |
| 8,004,092 | B2 | * | 8/2011 | Lin et al. ........................ 257/781 |
| 2001/0015439 | A1 | * | 8/2001 | Hembree et al. ................ 257/48 |
| 2003/0134496 | A1 | * | 7/2003 | Lee et al. ....................... 438/612 |
| 2003/0141593 | A1 | * | 7/2003 | Zuniga-Ortiz et al. ....... 257/750 |
| 2004/0207088 | A1 | | 10/2004 | Morozumi |
| 2007/0235878 | A1 | | 10/2007 | Lin et al. |
| 2009/0020878 | A1 | * | 1/2009 | Ryu et al. ...................... 257/773 |

FOREIGN PATENT DOCUMENTS

| | | |
|---|---|---|
| JP | 2004-273591 | 9/2004 |
| KR | 10-0376878 | 2/2002 |

* cited by examiner

*Primary Examiner* — Nitin Parekh
(74) *Attorney, Agent, or Firm* — Stanzione & Kim, LLP

(57) ABSTRACT

A semiconductor device including an interconnection structure including a copper pad, a pad barrier layer and a metal redistribution layer, an interconnection structure thereof and methods of fabricating the same are provided. The semiconductor device includes a copper pad disposed on a first layer, a pad barrier layer including titanium disposed on the copper pad, an inorganic insulating layer disposed on the pad barrier layer, a buffer layer disposed on the inorganic insulating layer, wherein the inorganic insulating layer and the buffer layer expose a portion of the pad barrier layer, a seed metal layer disposed on the exposed buffer layer, a metal redistribution layer disposed on the seed metal layer, and a first protective layer disposed on the metal redistribution layer.

19 Claims, 9 Drawing Sheets

INTER CONNECTION STRUCTURE INCLUDING COPPER PAD AND PAD BARRIER LAYER, SEMICONDUCTOR DEVICE AND ELECTRONIC APPARATUS INCLUDING THE SAME

CROSS-REFERENCE TO RELATED APPLICATIONS

This application claims the benefit of priority under 35 U.S.C. §119 from Korean Patent Application No. 10-2008-0095517, filed on Sep. 29, 2008, the contents of which are hereby incorporated herein by reference in its entirety.

BACKGROUND

1. Field of the Invention

The present general inventive concept relates to semiconductor devices including an interconnection structure, electronic apparatus, and methods of fabricating the same.

2. Description of the Related Art

Important factors for the next generation semiconductor device include miniaturization, light weight, high capacity, low power consumption, and high operating speed. To achieve these technological challenges, a variety of research on developing materials for semiconductor devices and enhancing structures thereof is underway. Accordingly, one conductive material receiving a good deal of focus is copper, which has low resistance and high conductivity. However, it is difficult to choose copper because it is easily oxidized, difficult to be etched and relatively expensive.

SUMMARY

Exemplary embodiments of the present general inventive concept provide interconnection structures including a copper pad and a pad barrier layer.

Exemplary embodiments of the present general inventive concept provide semiconductor devices including an interconnection structure.

Exemplary embodiments of the present general inventive concept provide electronic apparatus including a semiconductor device.

Exemplary embodiments of the present inventive concept provide methods of fabricating the semiconductor device including an interconnection structure.

Additional features and utilities of the present general inventive concept will be set forth in part in the description which follows and, in part, will be obvious from the description, or may be learned by practice of the general inventive concept.

The present general inventive concept is not limited to the descriptions thereof, and alternative embodiments will be clearly understood by those of ordinary skill in the art with reference to the following descriptions.

Exemplary embodiments of the present general inventive concept provide are directed to a semiconductor device, which includes a semiconductor device comprising an interconnection structure comprising a copper pad disposed on a first layer, a pad barrier layer including titanium disposed on the copper pad, an inorganic insulating layer disposed on the pad barrier layer, a buffer layer disposed on the inorganic insulating layer, wherein the inorganic insulating layer and the buffer layer expose a portion of the pad barrier layer, a seed metal layer disposed on the exposed buffer layer, a metal redistribution layer disposed on the seed metal layer, and a first protective layer disposed on the metal redistribution layer.

Example embodiments of the present general inventive concept are also directed to a semiconductor device comprising an interconnection structure comprising, a copper pad disposed on a silicon oxide, wherein the copper pad and the silicon oxide are at the same level, a pad barrier layer including titanium disposed on the copper pad, the pad barrier layer projects from the first layer, an inorganic insulating layer disposed on the pad barrier layer, a buffer layer disposed on the inorganic insulating layer, wherein the inorganic insulating layer and the buffer layer expose a portion of the pad barrier layer, a seed metal layer disposed on the exposed buffer layer, a metal redistribution layer disposed on the seed metal layer, and a first protective layer disposed on the metal redistribution layer, an internal circuit electrically connected to the copper pad in the first layer, and an input/output part to connect the interconnection structure to an external circuit.

Example embodiments of the present general inventive concept are directed to an electronic apparatus, a semiconductor device, and an interconnection structure comprising a copper pad disposed on a first layer of the semiconductor device, a pad barrier layer having titanium disposed on the copper pad, an inorganic insulating layer disposed on the pad barrier layer, a buffer layer disposed on the inorganic insulating layer, a seed metal layer disposed on the buffer layer, a metal interconnection layer disposed on the seed metal layer, and a first protective layer disposed on the metal interconnection layer, an internal circuit electrically connected to the copper pad in the first layer, and an input/output part to connect the interconnection structure to an external circuit, and a controller electrically connected to the semiconductor device, and an input/output unit electrically connected to the controller.

Example embodiments of the present general inventive concept are directed to a method of fabricating a semiconductor device including an interconnection structure and an electronic apparatus, which interconnection structure includes forming a copper pad on a bottom layer, forming a pad barrier layer including titanium on the copper pad, forming an inorganic insulating layer on the pad barrier layer, forming a buffer layer on the inorganic insulating layer, wherein the inorganic insulating layer and the buffer layer expose a portion of the pad barrier, forming a seed metal layer on the exposed buffer layer, forming a metal redistribution layer on the seed metal layer, and forming an upper protective layer on the metal redistribution layer to partially expose the metal redistribution layer.

The copper pad may be formed by a damascene process.

The first layer comprises silicon oxide and a first surface of the first layer is at the same level as a first surface of the copper pad.

The pad barrier layer may include a titanium layer formed by deposition, and a titanium nitride layer formed on the titanium layer by deposition.

The pad barrier layer may project from a top surface of the bottom layer.

The seed metal layer may be formed of copper or gold by deposition.

The seed metal layer may include a lower seed metal layer formed of titanium on the pad barrier layer, and an upper seed metal layer formed on the lower seed metal layer. The upper seed metal layer may be formed of at least one of cooper or gold.

The metal redistribution layer may be formed of gold, and may include a lower metal redistribution layer formed of the same metal as an uppermost part of the seed metal layer on the seed metal layer, and an upper metal redistribution layer formed of gold on the lower metal redistribution layer. The lower metal redistribution layer may be formed of copper.

The metal redistribution layer may be formed of gold, and may include a lower metal redistribution layer formed of the same metal as an uppermost part of the seed metal layer on the seed metal layer, and an upper metal redistribution layer formed of gold on the lower metal redistribution layer. The metal redistribution layer may further include an intermediate metal redistribution layer formed of nickel between the lower metal redistribution layer and the upper metal redistribution layer.

The inorganic insulating layer may be formed of silicon nitride, and expose a part of the top surface of the pad barrier layer.

The buffer layer may be formed of photosensitive polyimide by coating, and expose a part of the top surface of the pad barrier layer.

The upper protective layer may be formed of photosensitive polyimide containing epoxy.

A lower protective layer may be further formed between the buffer layer and the seed metal layer, and may be formed of polyimide containing epoxy resin by coating.

Other example embodiments will be described with reference to the detailed descriptions and the accompanying drawings.

BRIEF DESCRIPTION OF THE DRAWINGS

These and/or other features and utilities of the present general inventive concept will become apparent and more readily appreciated from the following description of the embodiments, taken in conjunction with the accompanying drawings of which.

DETAILED DESCRIPTION OF THE EMBODIMENTS

Figure 1A:
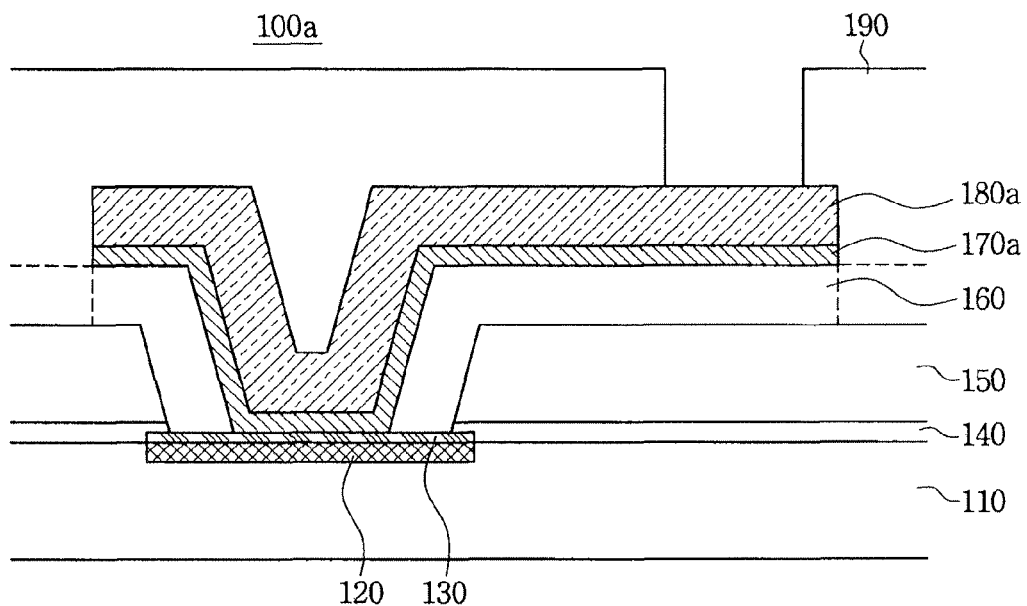
FIGS. 1A through 1E and 2 are cross-sectional views illustrating interconnection structures of a semiconductor device according to example embodiments of the present general inventive concept.

Reference will now be made in detail to the embodiments of the present general inventive concept, examples of which are illustrated in the accompanying drawings, wherein like reference numerals refer to the like elements throughout. The embodiments are described below in order to explain the present general inventive concept by referring to the figures. In the figures, the thicknesses of layers and regions may be exaggerated for clarity.

Detailed illustrative embodiments are disclosed herein. However, specific structural and functional details disclosed herein are merely representative for purposes of describing example embodiments. The present general inventive concept, however, may be embodied in many alternate forms and should not be construed as limited to only example embodiments set forth herein.

Accordingly, while example embodiments are capable of various modifications and alternative forms, embodiments thereof are illustrated by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof. It will be further understood that the term "formed on" may include one or more elements and/or layers being disposed on a particular surface and/or object, and that the term "formed between" may include one or more elements and/or layers disposed between surfaces and/or objects. Spatially relative terms, such as "beneath," "below," "lower," "above," "upper" and the like, may be used herein for ease of description to describe one element or a relationship between a feature and another element or feature as illustrated in the figures. It will be understood that the spatially relative terms are intended to encompass different orientations of the device in use or operation in addition to the orientation depicted in the Figures. For example, if the device in the figures is turned over, elements described as "below" or "beneath" other elements or features would then be oriented "above" the other elements or features. Thus, for example, the term "below" can encompass both an orientation which is above as well as below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized exemplary embodiments (and middle structures).

As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur in a different order than noted in the figures. For example, two figures illustrated in succession may in fact be executed substantially concurrently or may sometimes be executed in the reverse order, depending upon the functionality/acts involved.

In order to more specifically describe example embodiments of the present general inventive concept, various features and utilities will be described in detail with reference to the attached drawings. However, the present general inventive concept is not limited to example embodiments described.

Although the specification describes input/output pads and a redistribution structure of a semiconductor device, the spirit of the example embodiments may be applied more widely. For example, the spirit of the example embodiments can be applied to a common interconnection structure as well as the redistribution structure. Thus, the spirit of the example embodiments described herein can be widely applied to various interconnection structures in a semiconductor device and a method of fabricating the same, which will be included in the scope and spirit of the example embodiments of the present general inventive concept.

FIGS. 1A through 1D and 2 are cross-sectional views illustrating interconnection structures of a semiconductor device according to example embodiments of the present general inventive concept.

Referring to FIG. 1A, an interconnection structure 100a of a semiconductor device according to an example embodiment of the present general inventive concept includes a copper pad 120 formed on/in a bottom layer 110, a pad barrier layer 130 formed on the copper pad 120, an inorganic insulating layer 140 formed on the bottom layer 110 and the pad barrier layer 130, a buffer layer 150 formed on the inorganic insulating layer 140, a lower protective layer 160 formed on the buffer layer 150, a metal redistribution layer 180a formed on a part of a lower protective layer 160, and an upper protective layer 190 formed on the metal redistribution layer 180a.

The bottom layer 110 and the inorganic insulating layer 140 may be in direct contact with each other. The pad barrier layer 130 may be formed between the copper interconnection 120 and the inorganic insulating layer 140, which thus may not be in direct contact with each other. A seed metal layer 170a may be further formed between the lower protective layer 160 and the metal redistribution layer 180.

The inorganic insulating layer 140, the buffer layer 150 and the lower protective layer 160 may have openings to expose a part of the pad barrier layer 130. In the openings, the seed metal layer 170a may be directly formed on the pad barrier layer 130, and a metal redistribution layer 180a may be formed on the seed metal layer 170a. The inorganic insulating layer 140, the lower protective layer 160 and the seed metal layer 170a may be in direct contact with a surface of the pad barrier layer 130 exposed through the openings. The buffer layer 150 and the metal redistribution layer 180a may not be in direct contact with the surface of the pad barrier layer 130.

The upper protective layer 190 may at least partially expose a surface of the metal redistribution layer 180a. The lower and upper protective layers 160 and 190 may be formed of the same material, or any other suitable material.

The bottom layer 110 may be a material layer formed under the copper pad 120. The bottom layer 110 may include one or more layers, and the layers may be made of more or more materials. Alternatively, a surface of the bottom layer 110 may be at the same level as a surface of the copper pad 120. The bottom layer 110 may be a silicon substrate, a material layer formed of an insulating material, or a material layer having a conductive pattern, or any other suitable material. In the exemplary embodiments at least illustrated in FIG. 1A, the bottom layer 110 may be an insulating layer. For example, it may be an inter-layer dielectric layer (ILD) or an inter-metal dielectric layer (IMD). Alternatively, it may be a pre-metal dielectric layer (PMD). In the example embodiments illustrated in FIG. 1A, the bottom layer 110 may be formed of silicon oxide. In addition, it may contain carbon (C), hydrogen (H), fluorine (F), boron (B), or phosphorus (P), or any suitable combination thereof.

The copper pad 120 may be formed on one or more patterns transmitting electrical signals up or down, for example, contact plugs or via plugs in a semiconductor chip. The copper pad 120 may be a pattern electrically connected with patterns transmitting electrical signals more upwardly, e.g., contact plugs or via plugs further formed on a copper pattern, or electrically connected with patterns transmitting electrical signals in a lateral direction, e.g., interconnections. The copper pad 120 may be one or more patterns to transmit electrical signals outside the semiconductor chip. That is, the copper pad 120 may include input/output pads of the semiconductor chip. From another viewpoint, the copper pad 120 may be a part of a via plug, or a part of a copper interconnection. Generally, a pad indicates a structure formed between a via and a conductive pattern to make a cross-section of a via plug larger or make a connection with another conductive pattern, and a pattern designed in a quadrangular shape. However, the example embodiments of the present general inventive concept illustrated in FIG. 1A an interconnection-shaped pad, i.e., a linear pad.

The pad barrier layer 130 may either be formed on the entire surface or at least a portion of a surface of the copper pad 120. When the pad barrier layer 130 is formed on at least a portion of the copper pad 120, it may be formed on the exposed part of the copper pad 120. That is, at least a portion of the pad barrier layer 130 formed on the part of the copper pad 120 may be exposed. The pad barrier layer 130 may be formed of metal or any other suitable material in a single layer or multilayer structure. In the example embodiments illustrated in FIG. 1A, when the pad barrier layer 130 is formed in a multilayer structure, the multi-layered structure may be maintained or changed into single layers, as discussed in detail below. The example embodiments illustrate that the pad barrier layer 130 is formed on the top surface of the copper pad 120. The pad barrier layer 130 may project at least in part from the top surface of the bottom layer 110.

The pad barrier layer 130 may be formed of metal containing titanium. Titanium has increased adherence to the copper pad 120, and titanium nitride has an increased diffusion barrier properties. The pad barrier layer 130 may minimize and/or prevent possible damage from the exposure of the copper pad 120 to, for example, oxidation and contamination of the surface of the copper pad 120 and from diffusion of atoms or impurities. The pad barrier layer 130 may increase the protection of the copper pad 120 from impurity particles from other material layers to be formed on the copper pad 120, or chemical/physical damage. Instead of titanium, various other refractory metals may be used for the pad barrier layer 130. The example embodiments of FIG. 1A illustrate that the pad barrier layer 130 is formed of titanium since it is cheaper and more stable during the process than other materials, but the spirit of the example embodiments is not limited to titanium.

When the pad barrier layer 130 is formed in a multilayer structure, it may include a titanium layer at the bottom and a titanium nitride layer at the top. The pad barrier layer 130 formed in a single layer structure may be formed of a titanium nitride layer. However, a titanium nitride layer can be formed by nitrifying a titanium layer, and thus the pad barrier layer 130 may be formed in a single layer or multilayer structure according to the nitrification degree of the titanium layer. Alternatively, the titanium nitride layer may be directly formed on the titanium layer. In this case, the pad barrier layer 130 may maintain the titanium layer at the bottom.

The inorganic insulating layer 140 may be formed on the bottom layer 110, the copper pad 120 and the pad barrier layer 130. The inorganic insulating layer 140 may function to securely fix the bottom layer 110. That is, the inorganic insulating layer 140 may be formed of a material denser than the bottom layer 110. In addition, the inorganic insulating layer 140 may securely maintain a base of a material layer to be formed at the top. That is, the inorganic insulating layer 140 may be formed of a material denser than a material layer to be formed at the top. Generally, when the inorganic insulating layer 140 is formed of polymer or resin, for example, polyimide or epoxy resin, it is not expected to have reliable durability. Thus, in the example embodiments of the present general inventive concept, the inorganic insulating layer 140 may be formed of silicon nitride. If insulating layers are formed of polymer in subsequent processes, the semiconductor chip can be protected from shortcomings of polymers, such as penetration by water.

The buffer layer 150 may be formed of a material having increased flexibility and insulating properties than the inorganic insulating layer 140. In the example embodiment, the buffer layer 150 may be formed of polymer, BCB or resin, and preferably, photosensitive polyimide. Alternatively, the buffer layer 150 may be formed of another material such as silicon oxide or any other suitable material. In a semiconductor production process, after forming the buffer layer 150, the resulting product is generally transferred to outside a primary production line. In the primary production line, a wafer is processed. Subsequent processes may be performed in a secondary production line, in which final processes for fabricating the semiconductor chip, such as bumping, soldering, sawing and redistribution processes, may be performed. Generally, in the secondary production line, deposition is not performed. In other words, coating processes using polymer or resin are performed in the secondary production line.

The lower protective layer 160 may also be formed of an insulating layer. The lower protective layer 160 may be formed of polymer, BCB or resin, and preferably polyimide. In addition, the lower protective layer 160 may be formed of a different material from the buffer layer 150. That is, although both the lower protective layer 160 and the buffer layer 150 may be formed of polyimide, the lower protective layer 160 and the buffer layer 150 may be formed of polyimide containing different materials. For example, the buffer layer 150 may be formed of polyimide containing epoxy resin, and the lower protective layer 160 may also be formed of photosensitive polyimide. The lower protective layer 160 need not be formed of photosensitive polyimide containing epoxy resin.

The seed metal layer 170a may be formed in a single layer or multilayer structure. In the example embodiment, it is illustrated that the seed metal layer 170a is formed in a single layer structure. The seed metal layer 170a may vary according to the type of material used to form the metal redistribution layer 180a. For example, when the metal redistribution layer 180a is formed of copper, the seed metal layer 170a may be formed of a single copper layer or in a multilayer structure of titanium and copper. Of course, it can be formed of another metal layer. Alternatively, the seed metal layer 170a may be formed of a noble metal such as gold, silver or platinum having excellent electronic and physical characteristics, and the seed metal layer 170a is preferably formed of gold (Au). When the seed metal layer 170a is formed of a noble metal, it may be formed in a single layer or multilayer structure. For example, it may be a single layer of gold or platinum, or a multilayer formed of titanium and gold or titanium and platinum. Since the seed metal layer 170a is adjacent to and associated with the metal redistribution layer 180a, it may vary according to materials and structure of the seed metal layer 170a and the metal redistribution layer 180a. When the seed metal layer 170a is formed in a multilayer structure, a lowermost layer may be formed of titanium. Since titanium has improved adherence to other materials, the pad barrier layer 130 adheres very stably to the seed metal layer 170a.

The metal redistribution layer 180a may be formed in a single layer or multilayer structure. In the example embodiments illustrated in FIG. 1A, the metal redistribution layer 180a may be formed in a single layer or multilayer structure formed of copper, nickel or gold. The metal redistribution layer 180a is closely associated with the type of metal used to form the seed metal layer 170a. For example, an uppermost layer of the seed metal layer 170a and a lowermost layer 181 of the metal redistribution layer 180a may be formed of the same metal. That is, when the uppermost layer of the seed metal layer 170a is formed of copper, the lowermost layer 181 of the metal redistribution layer 180a may also be formed of copper, or when the uppermost layer of the seed metal layer 170a is formed of gold, the lowermost layer 181 of the metal redistribution layer 180a may also be formed of gold. When a multi-layered metal redistribution layer 180a includes a gold layer, an intermediate metal redistribution layer 183 formed of nickel may be further formed between the lower metal redistribution layer 181 formed of copper and the upper metal redistribution layer 185 formed of gold.

FIG. 1A illustrates the seed metal layer 170a and the metal redistribution layer 180a, each being formed in a single layer structure. In the exemplary embodiments, both the seed metal layer 170a and the metal redistribution layer 180a are formed of gold. FIG. 1A is provided to facilitate understanding of the spirit of the example embodiments of the present general inventive concept, and thus it may have a difference from a longitudinal cross-sectional view of an actual semiconductor chip. For example, when the pad barrier layer 130, the seed metal layer 170a and the metal redistribution layer 180a are formed of the same metal, interfaces therebetween are not visible. When an uppermost layer of the pad barrier layer 130 and the seed metal layer 170a are formed of the same metal, the uppermost layer of the pad barrier layer 130 and the seed metal layer 170a are illustrated as an integrated structure. Likewise, when the seed metal layer 170a and the metal redistribution layer 180a are formed of the same metal, the seed metal layer 170a and the metal redistribution layer 180a are illustrated as an integrated structure. This can be applied to other embodiments of the present general inventive concept in the same manner.

The upper protective layer 190 may also be formed of polymer. In the example embodiments of the present general inventive concept illustrated in FIG. 1A, the upper protective layer 190 may be formed of the same material as the lower protective layer 160. When the lower protective layer 160 is formed of the same material as the upper protective layer 190, an interface between the two material layers may not be visible. In general, the upper protective layer 190 may be formed of photosensitive polyimide having epoxy resin. In the upper protective layer 190, an opening partially exposing the metal redistribution layer 180a may be formed. In the opening, under bumped metal (UBM) or a bump may be formed.

Figure 1B:
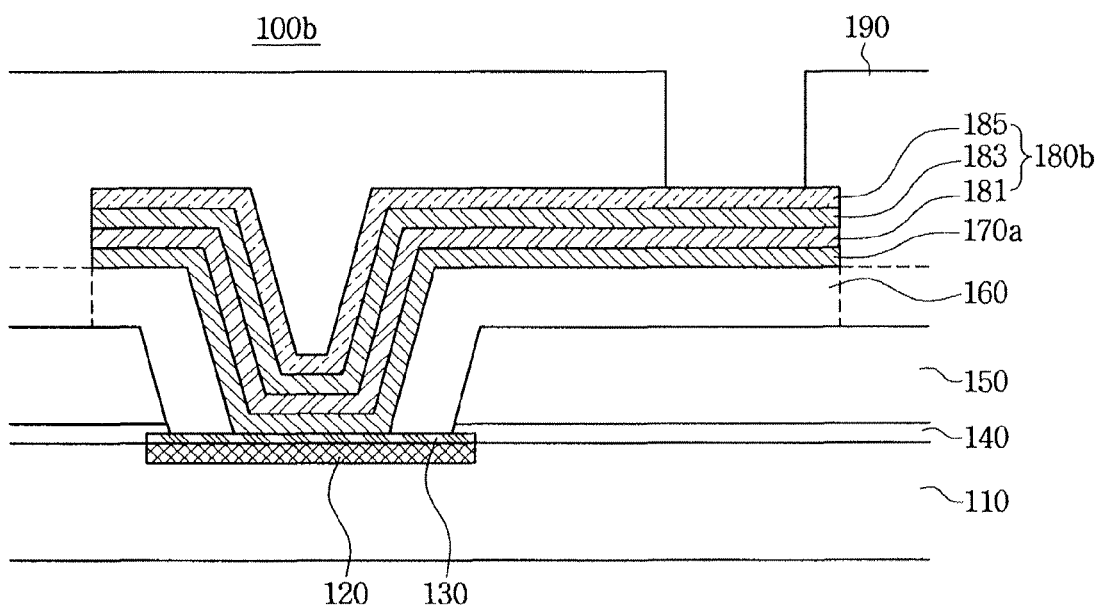

FIG. 1B illustrates an interconnection structure 100b having a metal redistribution layer 180b including a lower metal redistribution layer 181, an intermediate metal redistribution layer 183 and an upper metal redistribution layer 185 according to exemplary embodiments of the present general inventive concept. Referring to FIG. 1B, a seed metal layer 170a may be formed of copper, and the metal redistribution layer 180b may be formed in a multilayer structure of copper, nickel and gold. As described above in connection with FIG. 1A, when the seed metal layer 170a and the lower metal redistribution layer 181 are formed of the same metal, an interface between two metal layers 170a and 181 is not visible. Specifically, they appear to form an integrated structure.

Figure 1C:
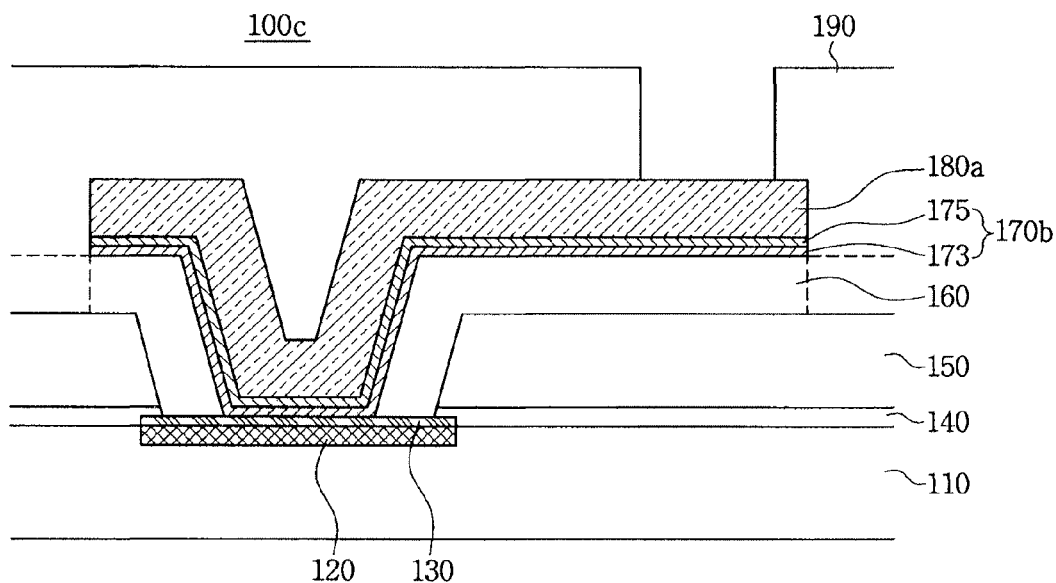

FIG. 1C illustrates an interconnection structure 100c having a seed metal layer 170b including a lower seed metal layer 173 and an upper seed metal layer 175 according to exemplary embodiments of the present general inventive concept. Referring to FIG. 1C, the lower seed metal layer 173 may be formed of titanium and the upper seed metal layer 175 may be formed of gold. As described above, when the upper seed metal layer 175 and the metal redistribution layer 180a are formed of the same metal, an interface between two metal layers 175 and 180a is not visible. Specifically, the upper seed metal layer 175 and the metal redistribution layer 180a are illustrated as an integrated structure.

Figure 1D:
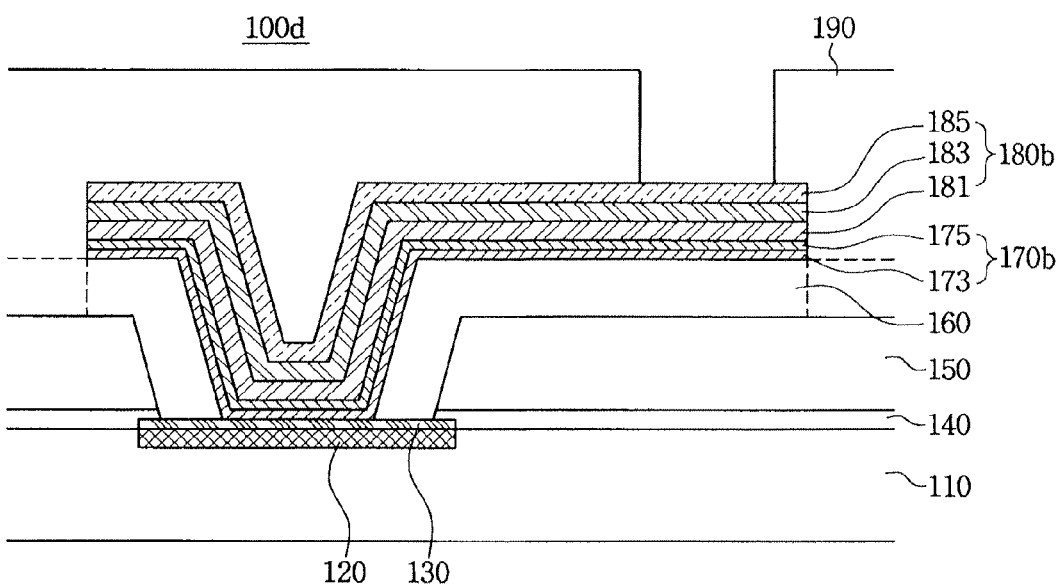

FIG. 1D illustrates an interconnection structure 100d having a seed metal layer 170b including a lower seed metal layer 173 and an upper seed metal layer 175, and a metal redistribution layer 180b including a lower metal redistribution layer 181, an intermediate metal redistribution layer 183 and a upper metal redistribution layer 185 according to exemplary embodiments of the present general inventive concept. Referring to FIG. 1D, the lower seed metal layer 173 may be formed of titanium, the upper seed metal layer 175 may be formed of copper, the lower metal redistribution layer 181 may be formed of copper, the intermediate metal redistribution layer 183 may be formed of nickel, and the upper redistribution metal later 185 may be formed of gold. As described above, when the upper seed metal layer 175 and the lower metal redistribution layer 181 are formed of the same metal, an interface between two metal layers 175 and 181 is not visible. Specifically, the upper seed metal layer 175 and the lower metal redistribution layer 181 are illustrated as an integrated structure.

In FIGS. 1A to 1D, dotted lines illustrate cross-sections of portions a semiconductor chip that may be selected according to the intentions of those who wish to practice the spirit of the example embodiments of the present general inventive concept. The layers described above are not necessarily formed of the above-mentioned metals.

Generally, the pad barrier layer 130 may be formed on the copper pad 120, a seed metal layer 170c may be formed on the pad barrier layer 130, a metal redistribution layer 180c may be formed on the seed metal layer 170c, and these layers 130, 170c and 180c may be formed of metal, respectively. The adjacent layers may be formed of the same material, and thus are not distinguished at an interface. This is illustrated in the interconnection structure 100e of FIG. 1E.

Figure 1E:
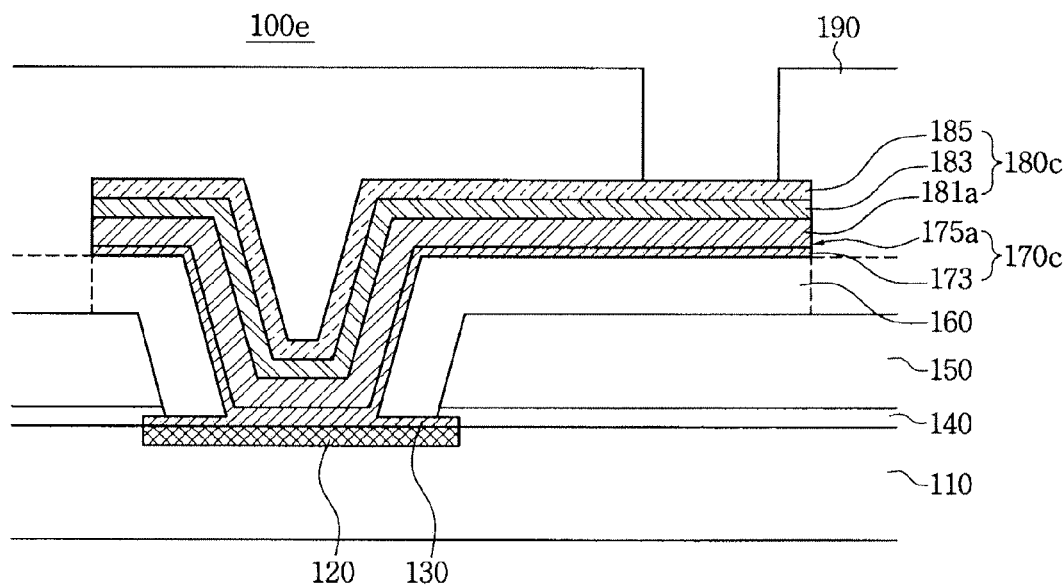

Referring to FIG. 1E, the pad barrier layer 130 and the lower seed metal layer 173 are illustrated as an integrated structure, and an upper seed metal layer 175a and a lower metal redistribution layer 181a are illustrated as an integrated structure. As described above, since these metal layers 175a and 181a may be sequentially formed of the same metal, the interface between the two metal layers 175a and 181a appears substantially not to exist.

Figure 2:
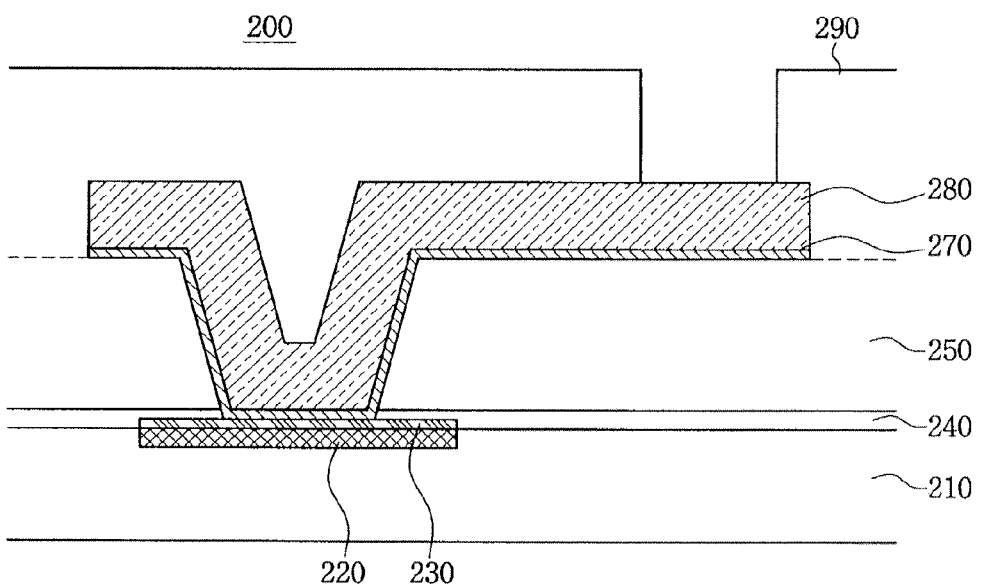

FIG. 2 illustrates a longitudinal cross-sectional view of an interconnection structure 200 of a semiconductor device according to example embodiments of the present general inventive concept. The buffer layer 150 and the lower protective layer 160 illustrated in FIGS. 1A through 1D may be formed in an integrated structure. In FIG. 2, a simplified structure is illustrated. A copper pad 220 may be disposed and/or formed on a bottom layer 210, and a pad barrier layer 230 may be disposed and/or formed on the copper pad 220. As an integrated buffer layer 250 may be formed of the buffer layer 150 and the lower protective layer 160, this process may be performed in one production line, particularly, in the primary production line. As described above, the buffer layer 150 may be formed in the primary production line, and the lower protective layer 160 may be formed in the secondary production line. Thus, the buffer layer 150 may be formed of an insulating material more flexible than an inorganic insulating layer 240, for example, silicon oxide, and the lower protective layer 160 may be formed of polymer by coating. The polymer, as described above, may be polyimide in the example embodiments of the present general inventive concept. At the same time, the integrated buffer layer 250 formed of the buffer layer 150 and the lower protective layer 160 may have increased insulating properties. Accordingly, for integration of these material layers 150 and 160, the buffer layer 150 and the lower protective layer 160 may be formed of polyimide rather than silicon oxide. Moreover, since the buffer layer 150 and the lower protective layer 160 have to be directly formed on the inorganic insulating layer 240, the buffer layer 150 and the lower protective layer 160 may be formed in the primary production line. At this time, the integrated buffer layer 250 may be formed of photosensitive polyimide excluding epoxy resin, and an upper protective layer 290 may be formed of photosensitive polyimide including epoxy resin. As described above, a seed metal layer 270 and a metal redistribution layer 280 may be formed in a multilayer structure.

FIGS. 3A through 3H illustrate a method of fabricating an interconnection structure of a semiconductor device according to example embodiments of the present general inventive concept. Here, the method of fabricating the interconnection structure 100d illustrated in FIG. 1D is illustrated in FIGS. 3A-3H, where interconnection structures 300a-300h are illustrated. Interconnection structures 300a-300h illustrate the plurality of stages of fabricating the interconnection structure 100d illustrated in FIG. 1D.

Figure 3A:
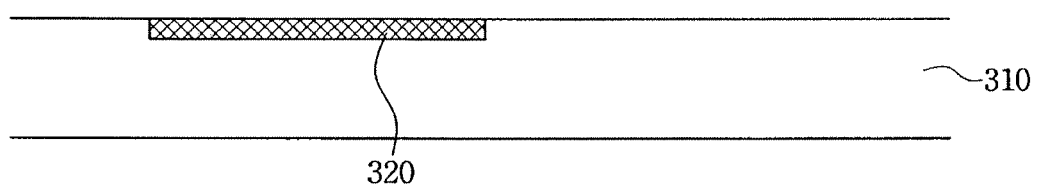
FIGS. 3A through 3H are cross-sectional views illustrating a method of fabricating an interconnection structure of a semiconductor device according to example embodiments of the present general inventive concept.

Referring to FIG. 3A, a copper pad 320 is formed in or on a bottom layer 310 in an interconnection structure 300a. The copper pad 320 may be formed by forming a region in which the copper pad 320 will be formed, filling the region with copper by plating, and then planarizing the plated result by CMP (chemical mechanical planarization). Generally, such a process is called a damascene process. Thus, a top surface of the bottom layer 310 and a top surface of the copper pad 320 are at the same level.

The bottom layer 310 may be formed to have a greater thickness than the copper pad 320, and formed of a relatively flexible material. It is considered that in the example embodiment the bottom layer 310 is formed of silicon oxide. The bottom layer 310 may contain another material to have lower permittivity and/or to enhance planarization characteristics. For example, the bottom layer 310 may include boron (B), phosphorus (P), fluorine (F), carbon (C), germanium (Ge), nitrogen (N) and/or one or more additional materials. That is, the bottom layer 310 may be formed of silicon oxide including one or more other materials. The bottom layer 310 may have low permittivity and a planarization function. At this time, the bottom layer 310 may be formed of silicon oxide, and include one or more other materials.

The copper pad 320 may be formed of pure copper, or a metal compound, or an alloy including copper. The metal compound containing copper denotes a material in which copper is chemically/physically mixed with, for example, a non-metal material, and the alloy containing copper denotes a material in which copper is mixed with another metal. Alternatively, it is denoted that the cooper pad 320 may be formed in a multilayer structure of copper and another material layer. In FIG. 3A, a cross-section of a single-layered copper pattern in interconnection structure 300a is illustrated.

Figure 3B:
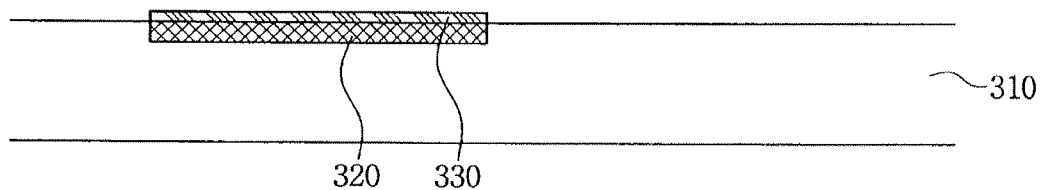

Referring to FIG. 3B, a pad barrier layer 330 is formed on the copper pad 320 in interconnection structure 300b. The pad barrier layer 330 may be formed on the entire surface of the copper pad 320, or at least a portion of the surface of the copper pad 320. As described above, the pad barrier layer 330 may be formed in a single layer or multilayer structure, and include a titanium nitride layer. For example, the pad barrier layer 330 may be formed of a titanium nitride layer, and may be formed in a multilayer structure of titanium and titanium nitride. More specifically, the pad barrier layer 330 may be formed by forming a titanium layer on the copper pad 320, and forming a titanium nitride layer on the titanium layer. The titanium layer may be formed by chemical vapor deposition (CVD) or physical vapor deposition (PVD). The titanium nitride layer may be formed by nitrifying a part of the titanium layer. Alternatively, the titanium nitride layer may be directly formed on the titanium layer. The pad barrier layer 330 may be formed of only a titanium nitride layer. At this time, the titanium nitride layer may be formed by forming a titanium layer on the copper pad 320, and completely nitrifying the titanium layer. The titanium nitride layer may be formed by CVD using plasma or thermal energy. In the example embodiments of the present general inventive concept, the pad barrier layer 330 may be formed to a thickness of about 1000 Å.

As illustrated in FIG. 3B, the copper pad 320 and the pad barrier layer 330 are aligned with each other, the alignment may vary according to a method of forming the pad barrier layer 330. For example, the pad barrier layer 330 may entirely cover a top surface of the copper pad 320 and be formed to be larger than the copper pad 320, or may not cover a part of an edge of the top surface of the copper pad 320 or at least a portion of a surface of the copper pad 320. This may be because the pad barrier layer 330 is generally formed by deposition, photolithography and etching. Here, the pad barrier layer 330 may be deposited on the top surface of the copper pad 320 and also on the bottom layer 310. Thus, a process of forming the pad material layer 330 on the copper pad 320 by patterning a material for the pad barrier layer 330 formed on at least a portion of or the entire surface of a semiconductor device may be performed. One exemplary method for this process is photolithography and etching. The copper pad 320 may be a larger pattern than other semiconductor patterns, having a side of several micrometers or more, thus increasing the ease in forming the pad barrier layer 330 on the copper pad 320. Deposition includes physical and chemical depositions. If the pad barrier layer 330 is formed and planarized by, for example, CMP, the pad barrier layer 330 may not project from the bottom layer 310.

Figure 3C:
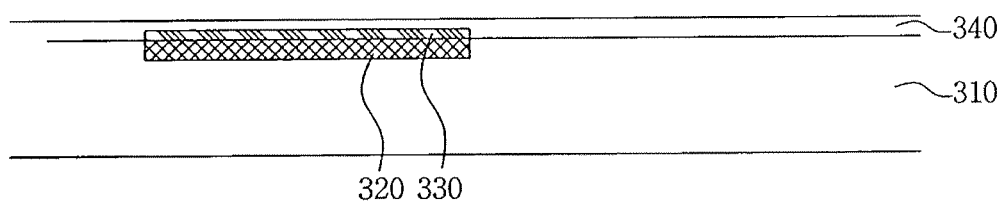

Referring to FIG. 3C, an interconnection structure 300c is illustrated where an inorganic insulating layer 340 is formed on the entire surface of the pad barrier layer 330. The inorganic insulating layer 340 may be directly formed on the pad barrier layer 330 and the bottom layer 310. That is, the bottom of the inorganic insulating layer 340 may be in contact with a top surface of the bottom layer 310. The inorganic insulating layer 340 formed on the projecting pad barrier layer 330 may project along a profile of the pad barrier layer 330. However, in FIG. 3C, to facilitate understanding of the spirit of the example embodiments of the present general inventive concept, it is considered that the inorganic insulating layer 340 has an even surface. The inorganic insulating layer 340 may be formed of a material that has a density that is greater than or equal to the bottom layer 310. The inorganic insulating layer 340 may function as an etch stop layer until another layer to be formed on the inorganic insulating layer 340 is patterned. The inorganic insulating layer 340 may be formed by CVD (chemical vapor deposition), be formed of silicon nitride (SixNy) or silicon oxynitride (SixOyNz), and contain a very small amount of impurities such as hydrogen. In the example embodiments of the present general inventive concept, the inorganic insulating layer 340 is formed of silicon nitride. Here, the inorganic insulating layer 340 may be formed to a thickness of about 6000 Å.

The inorganic insulating layer 340 may be formed by deposition using plasma. The materials for a semiconductor device may be more sensitive to heat as an integration degree of the semiconductor device is increased. As an inner structure of the semiconductor device decreased in size, the criticality of the process temperatures increased. That is, a state or a connection structure of a material layer previously formed may be changed or unstable due to high process temperature. Thus, in consideration of effects of heat on different material layers, a semiconductor device is preferably fabricated at low temperature so as to minimize change in state of a connection structure or instability. Plasma deposition may be performed at a temperature several hundreds of degrees lower than thermal deposition. Thus, in the example embodiment, the inorganic insulating layer 340 may be formed by plasma deposition. In addition, the process of fabricating a semiconductor device may be performed at a lower temperature step by step to reduce the thermal budget imposed on a material layer constituting the semiconductor chip. Thus, one or more early processes may be thermal processes, and the later processes may be plasma processes. While the thermal process is performed at a higher temperature and has a layer with a higher density than a plasma process, and has minimal or no damage resulting from a plasma radical, it takes a longer period of time and has a lower productivity than the plasma process. In the example of the present general inventive concept, the inorganic insulating layer 340 may be formed by plasma deposition, thereby reducing the thermal budget on the semiconductor chip, and may be more easily formed at an increased rate. A thick inorganic insulating layer 340 may adversely affect thermal and physical characteristics of the semiconductor chip, since it may restrict flexibility of the semiconductor chip. Thus, the inorganic insulating layer 340 may be formed to have a thickness that is less than or equal to the bottom layer 310 and a buffer layer 350 (illustrated in the interconnection structure 300d illustrated in FIG. 3D).

Figure 3D:
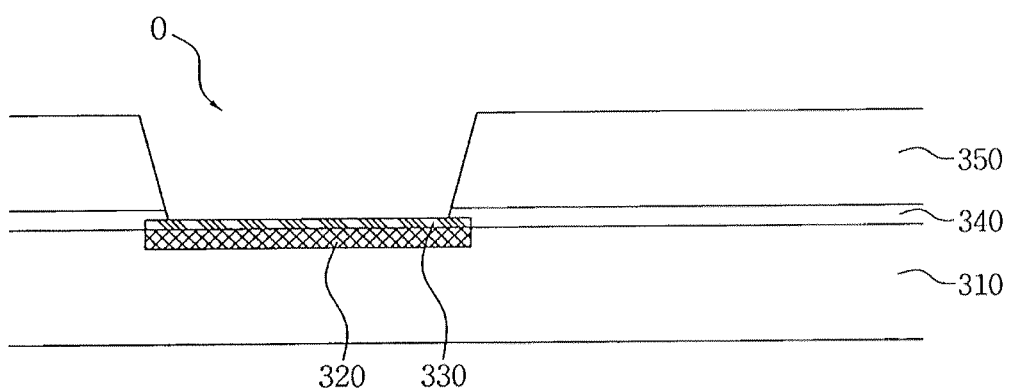

Referring to an interconnection structure 300d illustrated in FIG. 3D, a buffer layer 350 is formed on the inorganic insulating layer 340, and a first opening (identified as "O" in FIG. 3D) exposing a part of a surface of the pad barrier layer 330 is formed. In the example embodiments of the present general inventive concept, the buffer layer 350 may be formed of polymer by coating, rather than deposition. In the example embodiments, the buffer layer 350 may be formed of polyimide, and preferably, photosensitive polyimide. Photosensitive polyimide may have decreased difficulty in its preparation, and has increased flexibility and insulating properties, as compared to silicon oxide, and is applicable to a photolithography process. The formation and patterning of the material layer may be further simplified. Since the buffer layer 350 is formed of photosensitive polyimide, the first opening O may be formed without forming a photoresist pattern. A sidewall of the first opening O may be inclined. Compared to an opening formed vertically, the first opening O having the inclined sidewall has an increased ease in being patterned, and the patterned result has increased density. The first opening O may expose at least a portion of a top surface of the pad barrier layer 330 through the buffer layer 350 and the inorganic insulating layer 340. In the example embodiment, the buffer layer 350 may be formed to a thickness of several thousands of Å, for example, about 5000 Å. The processes including the formation of the buffer layer 350 having the first opening O are typically performed in the primary production line.

Figure 3E:
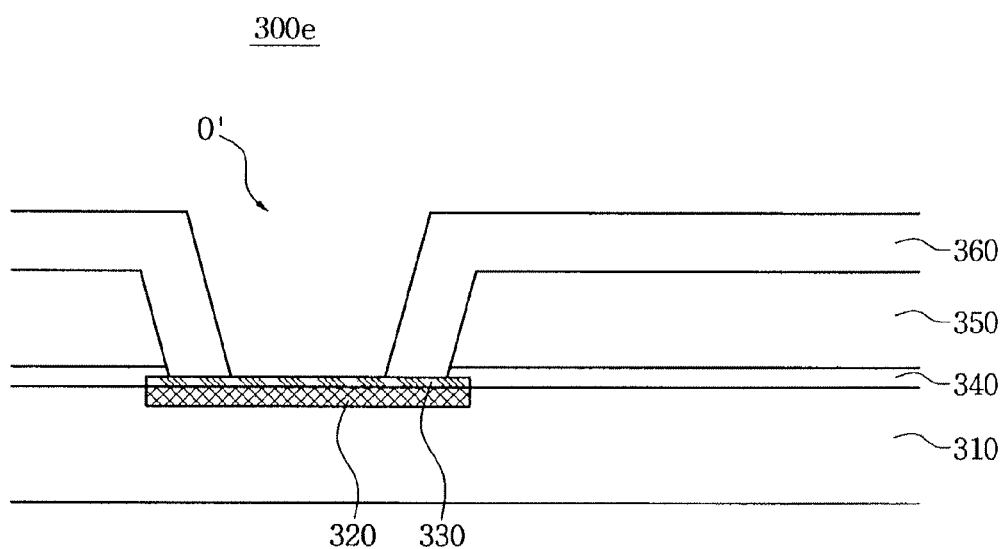

Referring to FIG. 3E that illustrates an interconnection structure 300e, a lower protective layer 360 is formed on the buffer layer 350, and a first opening O' which is narrower than the opening O illustrated in FIG. 3D is formed to partially expose a surface of the pad barrier layer 330. The lower protective layer 360 may also be formed of polymer. In the example embodiments of the present general inventive concept, the lower protective layer 360 may be formed of polyimide, and preferably photosensitive polyimide containing epoxy resin. From the formation of the lower protective layer 360 having the first opening O', the process may be performed in the secondary production line. The lower protective layer 360 may be formed thinner than the buffer layer 350. In the example embodiment, the lower protective layer 360 may be formed to a thickness ranging from about 4000 to 5000 Å.

Figure 3F:
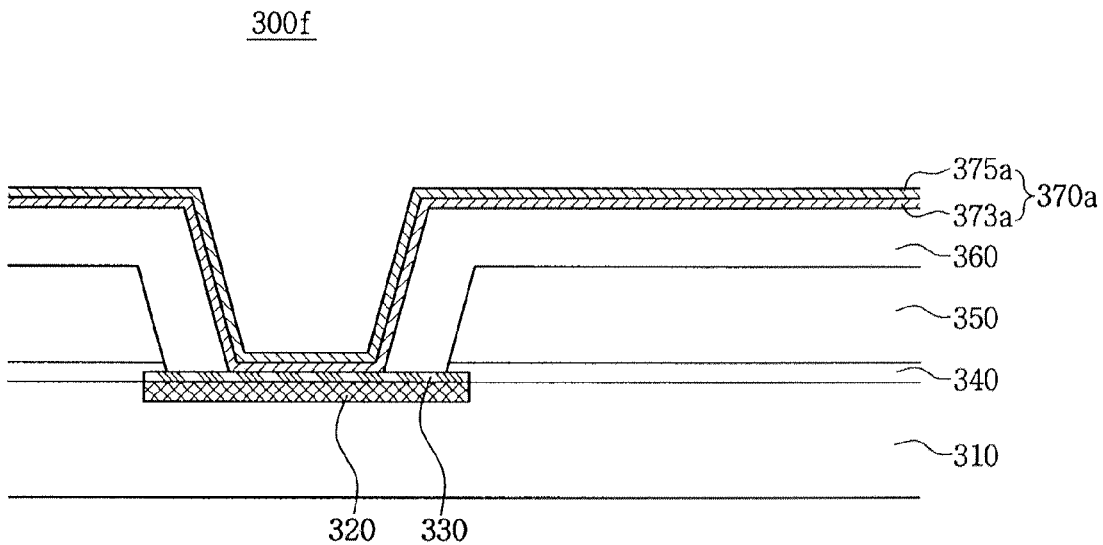

Referring to FIG. 3F that illustrates an interconnection structure 300f, a seed metal layer 370a may be formed on a top surface of the lower protective layer 360, a sidewall of the first opening O' and the exposed pad barrier layer 330. The seed metal layer 370a may be formed by PVD. The seed metal layer 370a may be formed in a single layer or multilayer structure, but in the example embodiments illustrated in FIG. 3F, it is formed in a multilayer structure. That is, the seed metal layer 370a may include a lower seed metal layer 373a and an upper seed metal layer 375a. The lower seed metal layer 373a may be formed of titanium. The upper seed metal layer 375a may be formed of copper or gold. When the seed metal layer 370a is formed in a multilayer structure, the lower seed metal layer 373a may be formed by PVD, and the upper seed metal layer 375a may be formed by PVD or plating. In the example embodiments illustrated in FIG. 3F, the seed metal layer 370a may be formed to a thickness ranging from about 2000 to 4000 Å. A single-layered seed metal layer may be formed to a thickness of about 2000 Å, while a multi-layered seed metal layer may be formed to a thickness of about 4000 Å.

Figure 3G:
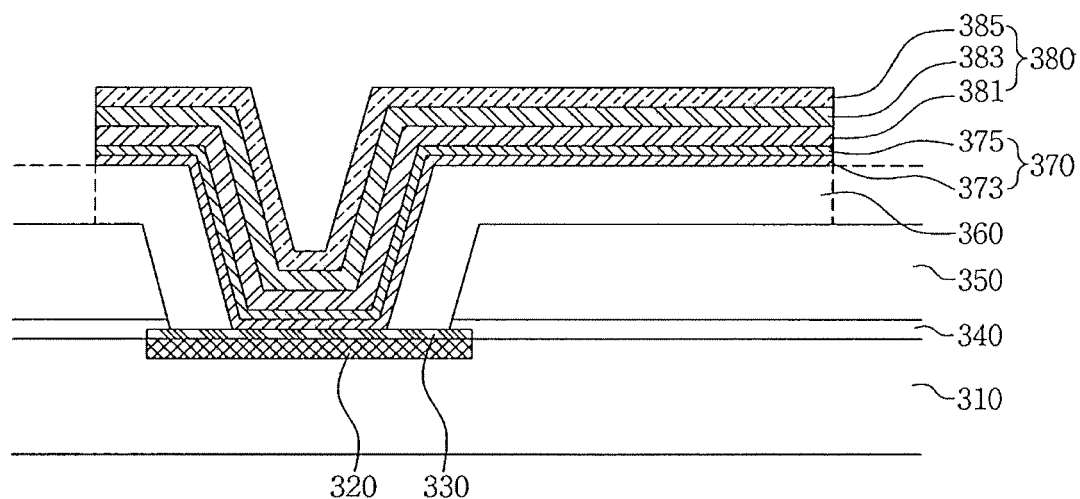

Referring to FIG. 3G that illustrates an interconnection structure 300g, a seed metal layer pattern 370, having upper seed metal layer 375 and lower seed metal layer 373, and a metal redistribution layer 380 are formed. The metal redistribution layer 380 may be formed by plating or deposition according to the type of metal, and, in the example embodiments illustrated in FIG. 3G, it is formed by plating. The metal redistribution layer 380 may be formed in a single layer or multilayer structure, and, in the example embodiments illustrated in FIG. 3G, it is formed in a triple layer structure. That is, the metal redistribution layer 380 may include a lower metal redistribution layer 381, an intermediate metal redistribution layer 383 and an upper metal redistribution layer 385. In the example embodiments illustrated in FIG. 3G, the lower metal redistribution layer 381 may be formed of copper, the intermediate metal redistribution layer 383 may be formed of nickel and the upper metal redistribution layer 385 may be formed of gold. In the example embodiments illustrated in FIG. 3G, the metal redistribution layer 380 may be formed to a thickness of several tens of thousands of Å. The lower protective layer 360 may be patterned in the same shape as the metal redistribution layer 380 and the seed metal layer pattern 370.

Figure 3H:
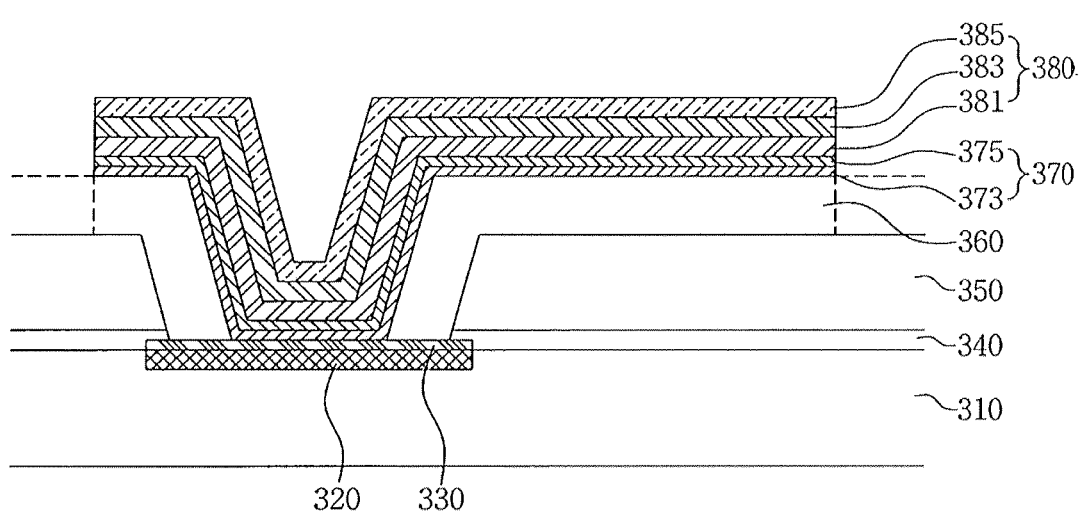

Referring to FIG. 3H that illustrates an interconnection structure 300h, an upper protective layer 390 is formed on the metal redistribution layer 380. The upper protective layer 390 may be formed on the entire surface of the semiconductor chip. The upper protective layer 390 may be formed of the same material as the lower protective layer 360. When the upper protective layer 390 and the lower protective layer 360 are formed of the same material, an interface between the two materials is not visible. Afterwards, an opening exposing a part of the metal redistribution layer 380 may be formed, and thus the interconnection structure 100d of the semiconductor device according to the example embodiment illustrated in FIG. 1D may be completed.

Figure 4:
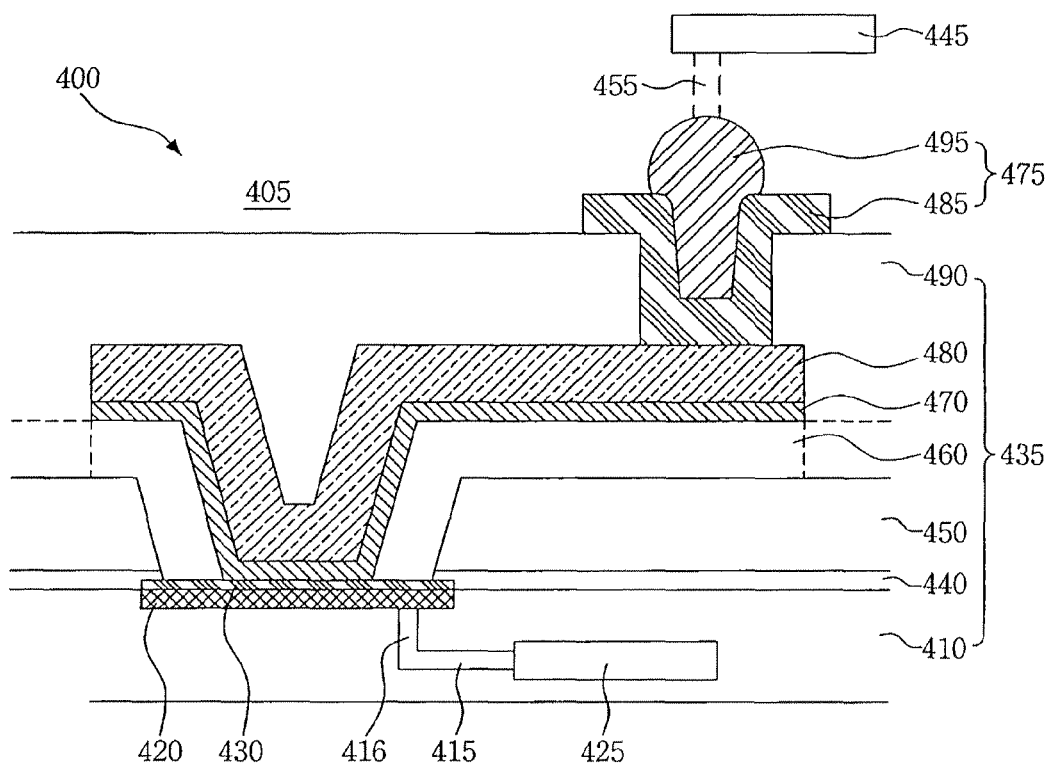
FIG. 4 is a cross-sectional view illustrating a semiconductor device including an interconnection structure according to example embodiments of the present general inventive concept.

FIG. 4 illustrates a semiconductor device including an interconnection structure according to an example embodiment of the present general inventive concept. Referring to FIG. 4, a semiconductor device 400 including an interconnection structure 405 according to an example embodiment of the present general inventive concept may include an interconnection structure 405, an internal circuit 425, and an input/output part 475. The interconnection structure 405 may be an interconnection structure according to an example embodiment of the present general inventive concept.

The interconnection structure 405 may be electrically connected to the internal circuit 425 through a conductive internal interconnection 415. The internal interconnection 415 may further include a conductive internal via plug 416. The internal circuit 425 may have one or more volatile and/or non-volatile memory devices.

The input/output part 475 may include a conductive input/output pad 485 and a conductive input/output bump 495. The input/output part 475 may be electrically connected to the interconnection structure 435. The input/output part 475 may be directly in contact with the interconnection structure 435.

The interconnection structure 435 may include an upper protective layer 490, a metal redistribution layer 480, a seed metal layer 470, a lower protective layer 460, a buffer layer 450, an inorganic insulating layer 440, a pad barrier layer 430, a copper pad 420, and a bottom layer 410. The copper pad 420 may be disposed and/or formed on a bottom layer 410, and the pad barrier layer 430 may be disposed and/or formed on the copper pad 220. The buffer layer 450 may be formed in a primary production line, and the lower protective layer 460 may be formed in a secondary production line. Thus, the buffer layer 450 may be formed of an insulating material more flexible than an inorganic insulating layer 440, for example, silicon oxide, and the lower protective layer 460 may be formed of polymer by coating. The polymer, as described above, may be polyimide in the example embodiments of the present general inventive concept. At the same time, the integrated buffer layer 450 formed of the buffer layer 450 and the lower protective layer 460 may have increased insulating properties. For integration of layers 450 and 460, the buffer layer 450 and the lower protective layer 460 may be formed of polyimide rather than silicon oxide. Moreover, since the buffer layer 450 and the lower protective layer 460 have to be directly formed on the inorganic insulating layer 440, the buffer layer 450 and the lower protective layer 460 may be formed in the primary production line. At this time, the buffer layer 250 may be formed of photosensitive polyimide excluding epoxy resin, and an upper protective layer 490 may be formed of photosensitive polyimide including epoxy resin. The seed metal layer 470 and a metal redistribution layer 480 may be formed in a multilayer structure.

The input/output part 475 may be electrically connected to the external circuit 445 through an external interconnection 455. The external interconnection 445 may be bonding wires, vias and/or interconnections of any semiconductor packages or semiconductor modules. The external circuit 445 may be any electrical circuit that may include one or more chipsets, controllers, amplifiers, power supplies, processors, memory, or any other electronic components.

Figure 5:
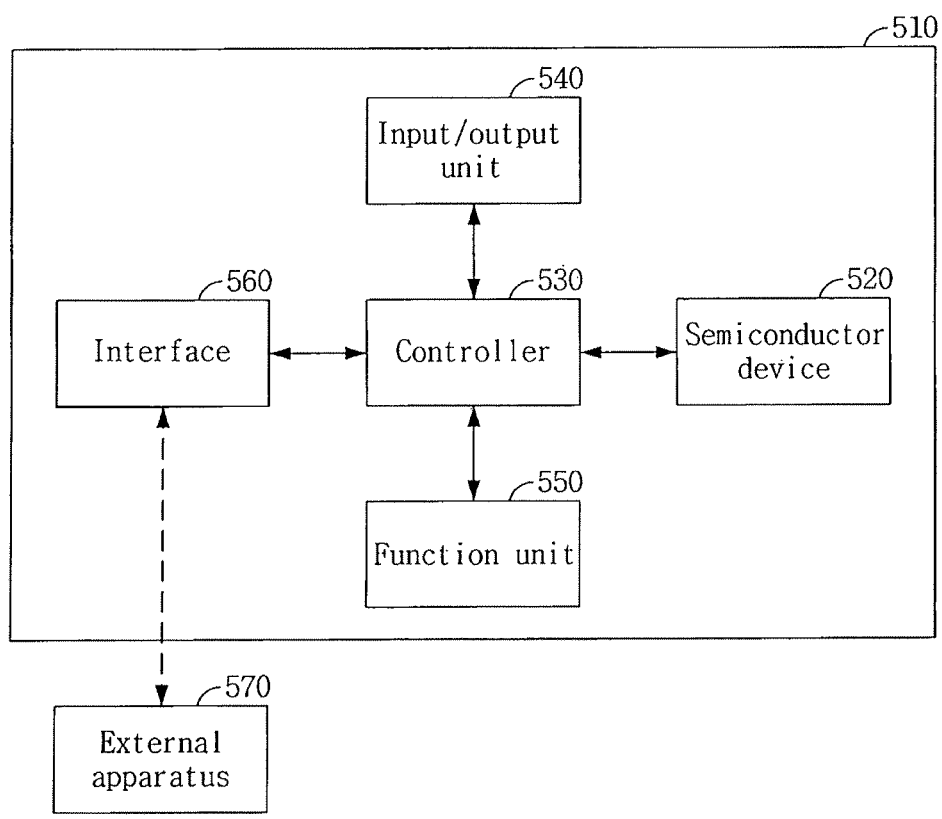
FIG. 5 is a block diagram illustrating an electronic apparatus including an interconnection structure according to an example embodiment of the present general inventive concept.

FIG. 5 is a block diagram illustrating an electronic apparatus 500 including an interconnection structure according to an example embodiment of the present general inventive concept. The electronic apparatus 500 may include a housing 510 to accommodate elements or units of the electronic apparatus 500, a semiconductor 520, a controller 530, an input/output unit 540, a function unit 550, and/or an interface unit 560 to communicate with an external apparatus 570 through a wired or wireless communication line to receive and transmit data or signal. At least one of the interconnection structures illustrated in FIGS. 1A through 2 can be used in the semiconductor device 520. The input/output part 475 (as illustrated in FIG. 4) of the semiconductor 520 can be connected to corresponding terminals of controller 530 to receive data to be stored or processed, or to transmit the stored or processed data in the semiconductor device. The data may be input through the input/output unit 540, the function unit 550, and/or the external apparatus 570 through the interface unit 560.

The function unit 550 may be a unit to perform a function or operation of the electronic apparatus 500. For example, when the electronic apparatus 500 is an image processing apparatus, a television apparatus, or a monitor apparatus, the function unit 550 may be a display unit to display an image and/or an audio output unit to generate a signal or sound according to the data. When the electronic apparatus is a mobile phone, the function unit 550 may be a mobile phone function unit to perform a mobile phone function, for example, dialing, text messaging, photographing using a camera unit formed on the housing 510, audio and video data processing to be displayed on a display unit formed on the housing 510, etc. When the electronic apparatus is an image forming or scanning apparatus, the function unit 550 may be an image forming unit to feed a printing medium, to form or print an image on the printing medium, or to scan a document or picture to be stored in the memory unit. When the electronic apparatus 500 is a camera or camcorder, the function unit 550 may be a unit to photograph an image as a movie or a still image.

The controller 530 controls elements and units of the electronic apparatus 500 or may be a processor. At least one of the interconnection structures illustrated in FIGS. 1A through 2 can be used in the controller 530. Therefore, the controller 530 can be referred to as the semiconductor device. The input/output part 475 (as illustrated in FIG. 4) of the controller 530 may be connected to corresponding terminals of the semiconductor device 520 or other units, for example, the input/output unit 540, function unit 550, and/or the interface unit 560, to transmit or receive data to or from the semiconductor device 520 or other units.

Names and functions of other components that are not represented by reference marks in the drawings will be easily understood with reference to the drawings and descriptions thereof.

According to a semiconductor device, an interconnection structure and methods of fabricating the same described above, the semiconductor device and the interconnection structure can have excellent characteristics due to a copper pad, and problems resulting from the copper pad can be completely solved by a pad barrier layer.

The foregoing is illustrative of example embodiments of the present general inventive concept and is not to be construed as limiting thereof. Although several example embodiments have been described, those skilled in the art will readily appreciate that many modifications are possible in example embodiments without materially departing from the novel teachings and advantages. Accordingly, all such modifications are intended to be included within the scope of this invention as defined in the claims. In the claims, means-plus-function clauses are intended to cover the structures described herein as performing the recited function, and not only structural equivalents but also equivalent structures. Therefore, it is to be understood that the foregoing is illustrative of various example embodiments and is not to be construed as limited to the specific embodiments disclosed, and that modifications to the disclosed embodiments, as well as other embodiments, are intended to be included within the scope of the appended claims.

What is claimed is:

1. A semiconductor device, comprising:
   an interconnection structure comprising:
   a copper pad disposed on a first layer;
   a pad barrier layer including titanium disposed on the copper pad;
   an inorganic insulating layer disposed on the pad barrier layer;
   a buffer layer disposed on the inorganic insulating layer, wherein the inorganic insulating layer and the buffer layer expose a portion of the pad barrier layer;
   a seed metal layer disposed on the exposed buffer layer;
   a second protective layer disposed between the buffer layer and the seed metal layer;
   a metal redistribution layer disposed on the seed metal layer; and
   a first protective layer disposed on the metal redistribution layer.

2. The device according to claim 1, wherein the first layer comprises silicon oxide and a first surface of the first layer is coplanar with a first surface of the copper pad.

3. The device according to claim 2, wherein the pad barrier layer projects from the first surface of the first layer.

4. The device according to claim 1, wherein the seed metal layer includes at least one of copper and gold.

5. The device according to claim 1, wherein the seed metal layer includes a first seed metal layer including titanium and a second seed metal layer.

6. The device according to claim 5, wherein the second seed metal layer comprises at least one of copper and gold.

7. The device according to claim 1, wherein the metal redistribution layer includes at least one of copper and gold.

8. The device according to claim 1, wherein the metal redistribution layer includes a first metal redistribution layer formed of the same metal as the seed metal layer and a second metal redistribution layer including gold.

9. The device according to claim 8, wherein the metal redistribution layer includes an intermediate metal redistribution layer including nickel that is disposed between the first metal redistribution layer and the second metal redistribution layer.

10. The device according to claim 1, wherein the inorganic insulating layer comprises silicon nitride, and exposes at least a part of a first surface of the pad barrier layer.

11. The device according to claim 1, wherein the buffer layer comprises polymer, and exposes at least a part of a first surface of the pad barrier layer.

12. The device according to claim 11, wherein the buffer layer comprises polyimide.

13. The device according to claim 1, wherein the first protective layer comprises polyimide containing epoxy.

14. The device according to claim 1, wherein the second protective layer and the first protective layer comprise polymer.

15. The device according to claim 14, wherein the second protective layer comprises polyimide containing epoxy resin.

16. The device according to claim 1, further comprising:
an internal circuit in the first layer; and
an input/output part to connect the interconnection structure to an external circuit.

17. The device according to claim 16, wherein the internal circuit is connected to the copper pad through an internal interconnection.

18. A semiconductor device, comprising:
an interconnection structure comprising:
a copper pad disposed on a first layer of silicon, wherein top surfaces of the copper pad and the silicon oxide are coplanar with each other;
a pad barrier layer including titanium disposed on the copper pad, the pad barrier layer projects from the first layer;
an inorganic insulating layer disposed on the pad barrier layer;
a buffer layer disposed on the inorganic insulating layer, wherein the inorganic insulating layer and the buffer layer expose a portion of the pad barrier layer;
a seed metal layer disposed on the exposed buffer layer;
a second protective layer disposed between the buffer layer and the seed metal layer;
a metal redistribution layer disposed on the seed metal layer; and
a first protective layer disposed on the metal redistribution layer,
an internal circuit electrically connected to the copper pad in the first layer; and
an input/output part to connect the interconnection structure to an external circuit.

19. An electronic apparatus comprising:
a semiconductor device comprising:
an interconnection structure comprising:
a copper pad disposed on a first layer of the semiconductor device;
a pad barrier layer having titanium disposed on the copper pad;
an inorganic insulating layer disposed on the pad barrier layer;
a buffer layer disposed on the inorganic insulating layer;
a seed metal layer disposed on the buffer layer;
a second protective layer disposed between the buffer layer and the seed metal layer;
a metal interconnection layer disposed on the seed metal layer; and
a first protective layer disposed on the metal interconnection layer,
an internal circuit electrically connected to the copper pad in the first layer; and
an input/output part to connect the interconnection structure to an external circuit; and
a controller electrically connected to the semiconductor device; and
an input/output unit electrically connected to the controller.

* * * * *